United States Patent [19]

Jacksier et al.

[11] Patent Number: 4,618,787
[45] Date of Patent: Oct. 21, 1986

[54] ADJUSTABLE TIME DELAY CIRCUIT

[75] Inventors: Barry H. Jacksier, Wheeling; Gary B. Ollendick, Mundelein, both of Ill.

[73] Assignee: AT&T Teletype Corporation, Skokie, Ill.

[21] Appl. No.: 559,619

[22] Filed: Dec. 9, 1983

[51] Int. Cl.⁴ ............................................. H03K 5/13
[52] U.S. Cl. ..................................... 307/591; 328/55
[58] Field of Search ............... 307/591, 590, 596, 597, 307/602, 606; 333/18, 139; 328/55

[56] References Cited

U.S. PATENT DOCUMENTS

| 3,378,703 | 4/1968 | Huxster et al. | 307/591 |
| 3,502,991 | 3/1970 | Sampson | 307/606 |
| 3,817,582 | 6/1984 | Green et al. | 307/606 |
| 3,911,368 | 10/1975 | Tarczy-Hornoch | 307/602 |

Primary Examiner—John S. Heyman
Assistant Examiner—Karl Ohralik
Attorney, Agent, or Firm—W. K. Serp; A. A. Tirva

[57] ABSTRACT

An adjustable time delay circuit 10, 50 includes a time delay line 12 including a plurality of series connected time delay units 18a-p. During adjustment, sampled signals along the delay line 12 are compared with a reference signal by NOR-gates 22e-m. Upon a comparison being attained, the output of the corresponding NOR-gate 22e-m sets a selected flip-flop 30e-m which in turn routes the signal at a selected delay line tap 38e-m through a NOR-gate 34e-m to an output OR-gate 40. The tap 38e-m selected, compensates for component propagation characteristics thus maintaining a predetermined time delay through the time delay circuit 10.

10 Claims, 4 Drawing Figures

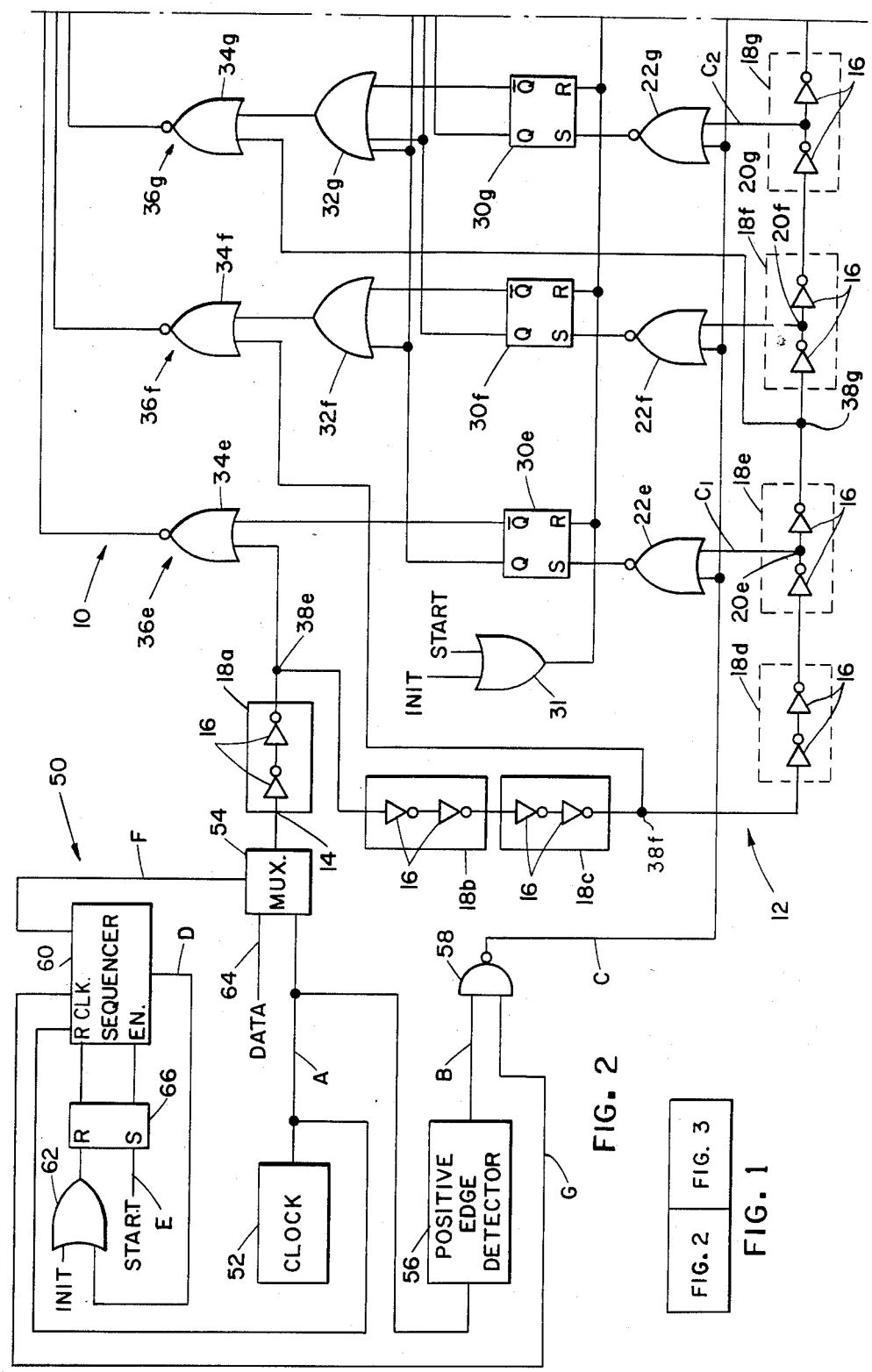

ADJUSTABLE TIME DELAY CIRCUIT

TECHNICAL FIELD

This invention relates to a time delay circuit which may be adjusted to compensate for changes in the propagation characteristics of the circuit components.

BACKGROUND OF THE INVENTION

Time delay circuits are used to provide a predetermined propagation delay to signals. In many applications, the time delay introduced by the time delay circuit is particularly critical. Environmental conditions, such as temperature, greatly effect the propagation characteristics of the circuit components. One way to compensate for a change in component propagation characteristics is by manually changing the value of one of the components of the time delay circuit. Frequently, the circuit is inaccessible or the adjustment must be made with such rapidity that manual adjustment is not suitable. In certain situations, the time delay adjustment must be made automatically or accomplished by remote control. Further, various applications require different degrees of resolution; that is, varying adjustment increments are required.

DISCLOSURE OF THE INVENTION

An adjustable time delay circuit is shown which includes an adjustment for compensating for environmental influences. The circuit includes an input terminal, an output terminal and a plurality of serially connected time delay elements forming a tapped time delay line. First and second means are provided for generating first and second time related signals with the first signal fed to the input of the time delay line. Third means are responsive to the first signal at a plurality of selected locations along the time delay line and to the second signal. The third means provides one of a plurality of possible control signals in response to a predetermined relationship between the first and second signals. A plurality of signal activated switches are included with each switch being responsive to a corresponding one of said control signals for connecting a selected time delay line tap to the output terminal.

THE DRAWING

FIG. 1, which is a combination of FIGS. 2 and 3, is a schematic of an adjustable time delay circuit; and FIG. 4 is a timing diagram of selected signals of the adjustable time delay circuit of FIG. 1.

DETAILED DESCRIPTION

Figure 3:
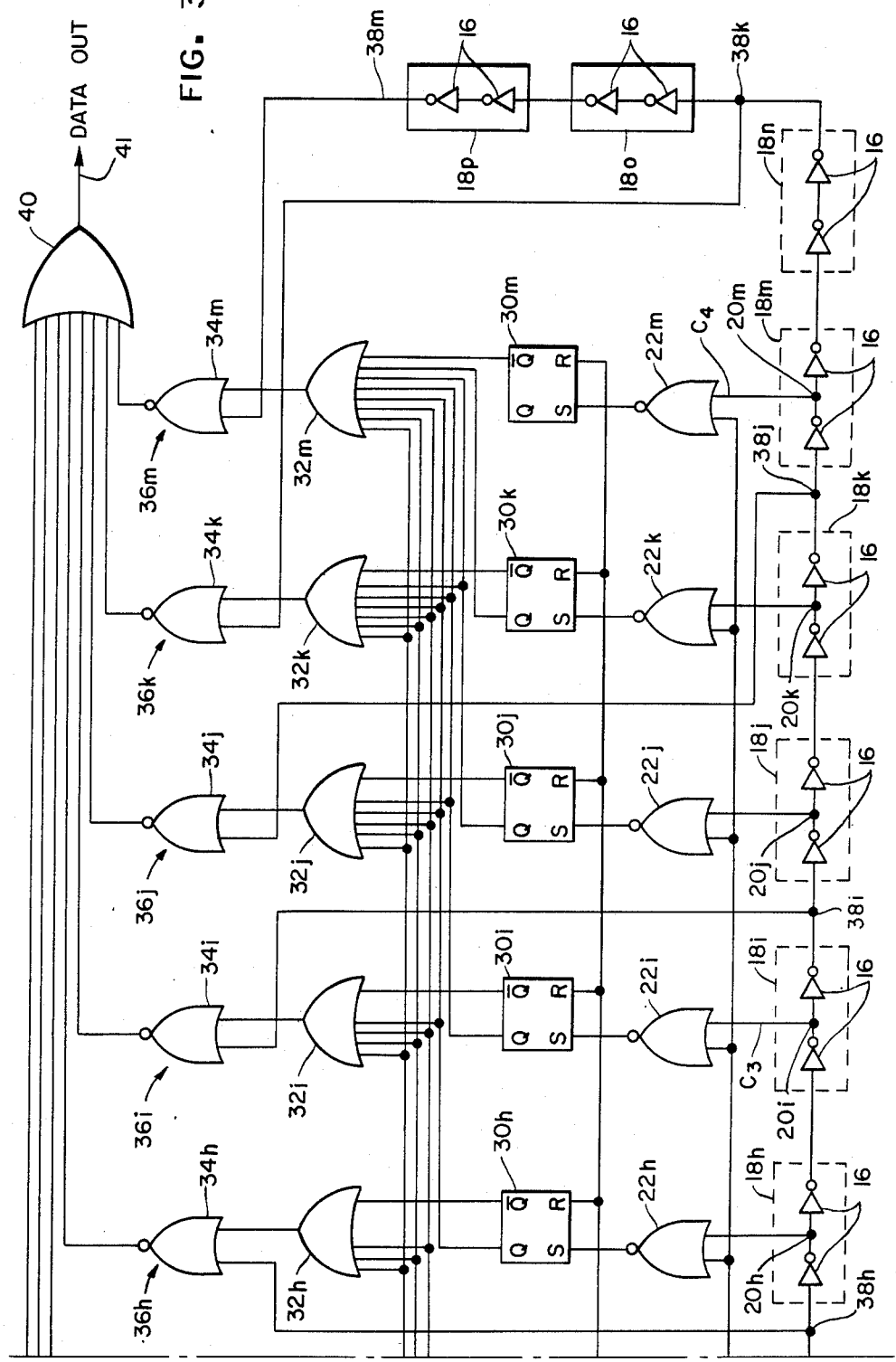

As illustrated, the time delay circuit 10 includes a delay line 12 having an input terminal 14 and a plurality of series connected signal inverters 16. Each pair of inverters 16 comprise a time delay unit 18$a$-$p$. The junction between each pair of inverters in each time delay unit 18$e$-$m$ provides a signal sampling tap 20$e$-$m$. As illustrated, the delay line 12 includes fifteen delay units 18$a$-$p$. It will be appreciated that the number of delay units 18$a$-$p$ and the propagation characteristics of the inverters 16 may be varied to obtain the total time delay and the degree of adjustment resolution desired. At the center of the delay line 12, the signal sampling tap 20$h$ is considered to be nominal; that is, the propagation delay from the input terminal 14 to the nominal tap 20$h$ is the time delay anticipated under normal environmental conditions. Connected to each signal sampling tap 20$e$-$m$ is one input of a dual input comparison NOR-gate 22$e$-$m$. The remaining inputs to each of the NOR-gates 22$e$-$m$ are commonly connected to a reference signal C. Each NOR-gate 22$e$-$m$ compares the signal levels at its two inputs and provides a related control signal. For example, as long as one input to the NOR-gate 22$e$ is high, the output will be low. When both inputs are low, the output of the NOR-gate 22$e$ will be high. The output of each NOR-gate 22$e$-$m$ is fed to the set input of an associated R-S flip-flop 30$e$-$m$, and the reset input of each flip-flop 30$e$-$m$ is connected to the output of an OR-gate 31. One input of the OR-gate 31 is connected to an initialization pulse which may be generated upon the application of power to the circuitry. The remaining OR-gate 31 input is connected to a start signal. Either of these signals will initialize all of the flip-flops 30$e$-$m$ to their reset condition with Q low.

Additionally, there are a plurality of lock-out OR-gates 32$f$-$m$ being one less in number than the number of flip-flops 30$e$-$m$. The direct output Q of each flip-flop 30$e$-$m$, except the last flip-flop 30$m$, is fed to one input of each of the OR-gates 32$f$-$m$ associated with flip-flops 30$f$-$m$ controlled by NOR-gates 22$e$-$m$ responding to signal sampling taps 20$e$-$m$ at progressively increasing signal time delays. The complement output of each flip-flop 30$e$-$m$, with the exception of the first flip-flop 30$e$, is fed to one input of its associated OR-gate 32$f$-$m$. The output of the first flip-flop 30$e$ is fed to the input of a switching NOR-gate 34$e$, and the outputs of the OR-gates 32$f$-$m$ are fed to inputs of corresponding switching NOR-gates 34$f$-$m$. The flip-flops 30$e$-$m$, together with their associated lock-out OR-gates 32$f$-$m$ and switching NOR-gates 34$e$-$m$, form switching units 36$e$-$m$. Each switching unit 36$e$-$m$ is activated by a corresponding NOR-gate 22$e$-$m$ with those switching units 36$e$-$m$ responding to control signals from NOR-gate 22$e$-$m$ at increased propagation delays along the delay line 12 being disabled. In other words, switches 36$e$-$m$ responding to NOR-gate 22$e$-$m$ output signals subsequent in delay to the selected switch will be disabled.

A remaining input to each of the switching NOR-gates 34$e$-$m$ is connected to one selected output connection 38$e$-$m$ of the delay line 12, and each output of each of the NOR-gates 34$e$-$m$ is connected to one input of a multiple input OR-gate 40. The output of the OR-gate 40 is the output terminal 41 of the time delay circuit 10. It will be appreciated that regardless of which switch 36$e$-$m$ output is provided the output signal through the OR-gate 40, the propagation characteristics of the components between the selected output connection 38$e$-$m$ of the delay line 12 and the output of the OR-gate 40 are similar. That is, each propagation path includes a single switching NOR-gate 34$e$-$m$ and the output OR-gate 40. Since all of the circuitry of the time delay circuit 10 is generally contained in a uniform environment, the variations in propagation characteristics for all circuit components wil be similar. Thus, if the propagation time of the inverters 16 forming the delay line 12 increases, the propagation time introduced by each switching NOR-gate 34$e$-$m$ and the time delay through the OR-gate 40 will similarly increase by a determinable amount. In such an event, propagation delay is removed by switching the output connection 38$e$-$m$ of the delay line 12 to an output connection 38$e$-$m$ closer to the input terminal 14 of the delay line 12. Environmental conditions, which decrease the propagation time delay of the components between the anticipated nominal value, are compensated for by selecting an output connection 38e–m at a location along the delay line 12 which increases the active portion of the delay line 12. Under such conditions, the selected output tap 38e–m increases the propagation delay through the active portion of the delay line 12 taking into consideration the decreased delay through the associated switching NOR-gate 34e–m and the output OR-gate 40. Since the components of the time delay circuit 10 have known propagation vs. temperature characteristics, the overall time delay may be adjusted to obtain a desired value. The time delay circuit 10 may be conveniently adjusted by the exemplary adjustment circuit 50 illustrated in FIG. 2.

The adjustment circuit 50 includes a clock 52 generating a square wave signal A which is fed into a multiplexer 54, the output of which is connected to the input terminal 14 of the time delay line 12. The output signal A (FIG. 2) of the clock 52 passes through a positive edge detector 56 which generates a positive going pulse B fed to one input of a dual input NAND-gate 58. The output C of the NAND-gate 58 provides a negative going pulse, during a selected time interval to the inputs of the NOR-gates 22e–m. Control of the calibration circuit 50 is with a sequencer 60 in the form of counter driven decoder. A first output signal D of the sequencer 60 is fed to a first input of an OR-gate 62, the output of which is connected to the reset input of an R-S flip-flop 66. The second input of the OR-gate 62 is fed by the initialization signal INIT. The direct output of the R-S flip-flop 66 is connected to the reset input of the sequencer and the complement output of the R-S flip-flop is connected to an enable input of the sequencer 60. When the output D of the sequencer 60 is low, the INIT pulse passes through the OR-gate 62 resetting the flip-flop 66 and presetting the sequencer 60. In response to a start pulse E, occurring slightly after time t1, supplied by an external source to the set input of the flip-flop 66, the sequencer 60 is enabled and advances in response to the output A of the clock 52. A second output signal F of the sequencer 60 is fed to the multiplexer 54 which switches the output of the multiplexer at time t2 from a data source on line 64 to the output A of the clock 52. In response to the falling edge of the clock cycle at time t6, the NAND-gate 58 is enabled by an output signal G from the sequencer 60. Several clock cycles during time period t2–t6 pass through the delay line 12 assuring that the delay line 12 attains a predetermined initial state prior to enabling the NAND-gate 58.

Figure 4:
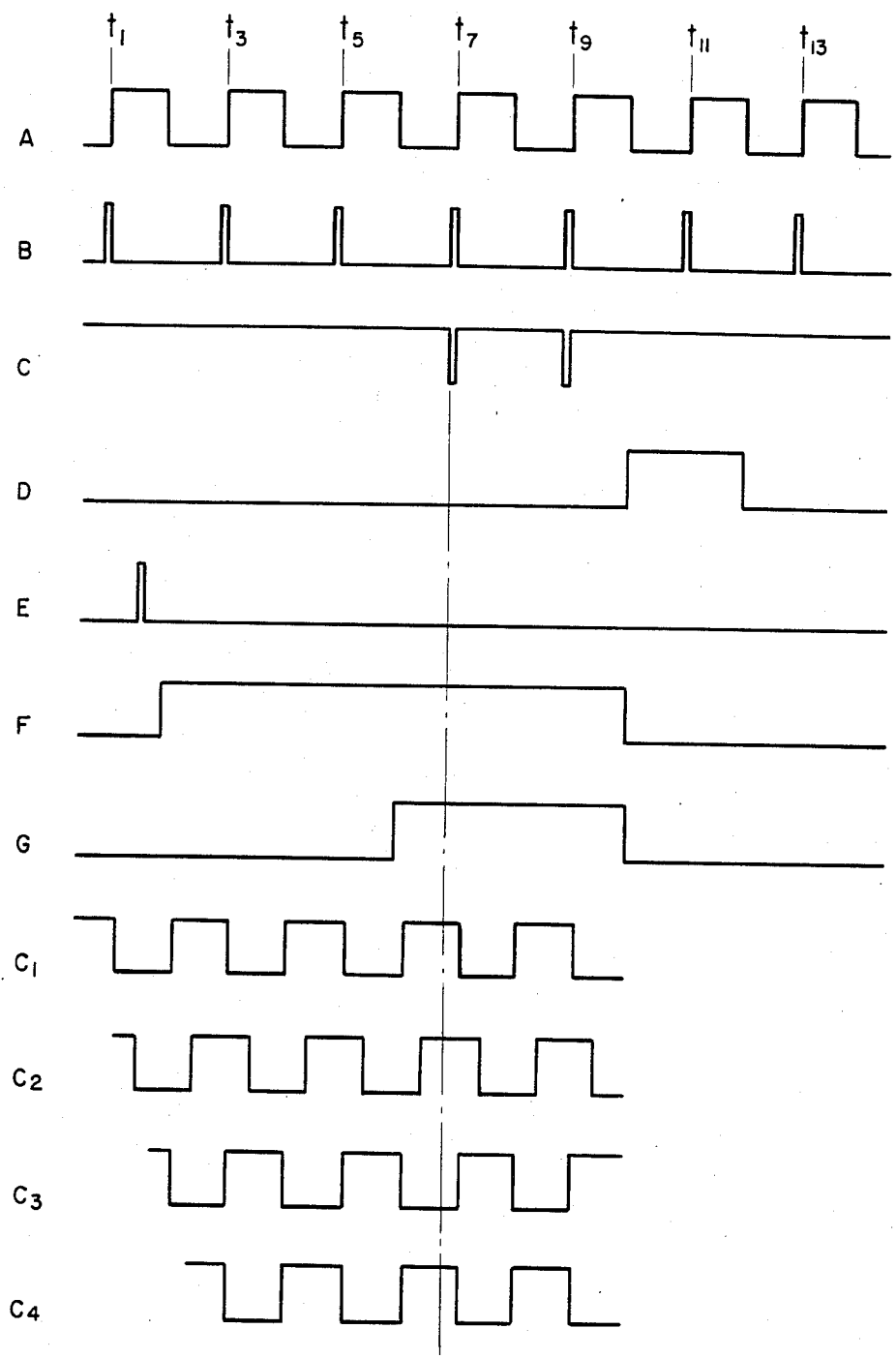

The signals C1, C2, C3 and C4, taken from selected sampling taps 20e, 20g, 20i and 20m along the delay line 12, are illustrated in FIG. 4. The various tap signals C1, C2, C3 and C4 are shown delayed in time to indicate their relative positions along the delay line 12. After several clock cycles have passed through the delay line 12 (t2–t6), the sequencer 60 enables the NAND-gate 58; and the output of the positive edge detector 56 appears at the output of the NAND-gate 58 as negative going pulses at times t7 and t9. The output signal from the NAND-gate 58 is compared with the signals C1, C2, C3 and C4 by the NOR-gates 22e, 22g, 22i and 22m. The first coincidence of a negative going train pulse C with a negative going signal occurs at the input to a NOR-gate 22i at time t7 (signal C3). In response to this occurrence, the output of the NOR-gate 22i goes high setting the associated flip-flop 30i. The direct output of the flip-flop 30i locks out all subsequent OR-gates 32j–m.

Additionally, the complement output of the flip-flop 30i passes through its related OR-gate 32i placing a low level at the input of the NOR-gates 34i. The output of the activated NOR-gate 34i now follows the signal level at the output connection 38i of the delay line 12 which is connected to the remaining NOR-gate 34i input. Thus, the activated NOR-gate 34i selects the output connection 38i which provides the necessary signal propagation delay through the delay line 12 to maintain the total time delay through the time delay circuit 12 at the desired value. In the event that the components forming the time delay circuit 10 have increased their propagation characteristics, the coincidence between the signal C and a low level at one of the remaining NOR-gates 22e–h inputs would occur earlier selecting a delay line 12 output connection 38g–m further toward the input terminal 14. After adjustment of the time delay circuit 10, the sequencer output signal F goes low at time t10; and the multiplexer input is switched to the data signal on line 64.

Although this invention has been shown and described in connection with a preferred embodiment, it will be understood that various changes in form and detail may be made without departing from the scope and spirit of the invention as defined by the following claims.

We claim:

1. An adjustable time delay circuit (10) which includes an adjustment feature compensating for environmental influences comprising:

an input terminal (14);

an output terminal (41);

a plurality of serially connected time delay elements (16) forming a tapped time delay line (12), said time delay line having one end thereof connected to the input terminal;

first means (52) for generating first signal (A), said first signal being fed to the input terminal of said time delay line (12);

second means (56) for generating second signal (C) in response to said first signal;

third means (22e–m) responsive to said first signal at a plurality of selected locations along said time delay line (12) and responsive to said second signal for providing one of a plurality of possible control signals in response to a predetermined relationship between said first (A) and second (C) signals; and a plurality of signal activated switches (36e–m), each switch being responsive to a corresponding one of said control signals for connecting a selected tap (38e–m) of said time delay line (12) to said output terminal (41).

2. An adjustable time delay circuit (10, 50) including a plurality of components having signal propagation characteristics which are effected by environmental conditions comprising:

a plurality of serially connected time delay elements (16) forming a tapped time delay line (12);

first means (52) for generating first signal (A), said first means (52) for generating said first signal being connected to an input of said time delay line (12);

second means (56) for generating second signal (C) in response to said first signal;

means (22e–m) responsive to said first signal (A) at selected taps (20e–m) of said time delay line (12) and to said second signal (C) for providing one of a plurality of control signals in response to a predetermined relationship between the first signal (A)

appearing at the selected tap and said second signal (C); and a plurality of switches (36e-m), each switch having approximately the same signal propagation characteristics and each being responsive to a corresponding one of said control signals for switching a selected tap of said time delay line (12) through a selected one of said switches (36e-m) to an output terminal (41), the propagation characteristics through the selected one of said switches (36e-m) and said time delay line (12) providing a predetermined time delay to signals passing therethrough.

3. The adjustable time delay circuit (10, 50) of claim 2 wherein the environmental influences on said time delay line (12) after the electrical characteristics of the time delay line (12) in a manner similar to the alteration of the electrical characteristics of the switch (36e-m) in response to the same environmental influences.

4. The adjustable time delay circuit (10, 50) of claim 3 which provides a nominal time delay condition at a selected tap (38h) along said time delay line (12), a selected one of said switches selects a tap (38e-m) introducing a greater portion of the time delay line (12) in response to said predetermined relationship occurring at a location on said time delay line (12) subsequent to said selected nominal tap (38h).

5. The adjustable time delay circuit (10, 50) of claim 4 wherein said control signal generating means (22e-m) includes a plurality of gates, one input of each of said gates is connected to said second signal generating means (56) for receiving said second signal (C), and the second input of said means (22e-m) is connected to a selected one of the taps (38e-m) along said time delay line (12).

6. The adjustable time delay circuit (10, 50) of claim 5 wherein each of said switches (36e-m) includes means (30e-m), (32f-m) for disabling those switches (36e-m) controlled by a control signal generated in response to subsequent delay line conditions.

7. The adjustable time delay circuit (10, 50) of claim 6 wherein said first generating means includes a clock (52) having first and second edge transitions, means (56) for detecting said first edge transition and generating a short duration pulse (B) providing said second signal (C).

8. An adjustable time delay circuit (10, 50) comprising:
a time delay line (12) having an input terminal (14) and a plurality of output connections (38e-m) and providing time delays to signals passing from said input terminal (14) to said output connections (38e-m), said time delay line comprising a plurality of serially connected inverters (16), selected inverter connections (20e-m) providing sampling taps;
first and second means (52, 56) for generating first and second time related signals, said first signal means (52) being connected to the input terminal (14) of said time delay line (12);
a plurality of first logic gates (22e-m) equal in number to the number of sampling taps (20e-m), one input of each of said first logic gates (22e-m) connected to a corresponding one of said sampling taps (20e-m), and a second input of each of said first logic gates (22e-m) connected to said second signal generating means (56), the output of each of said first logic gates (22e-m) providing a third signal in response to a predetermined relationship between the first and second signals (A, C) at the corresponding inputs of said first logic gates (22e-m);

a plurality of flip-flops (30e-m), one input of each flip-flop (30e-m) being connected to a corresponding output of one of said first logic gates (22e-m);

a plurality of second logic gates (32f-m), the number of said second logic gates (32f-m) being one less than the number of said flip-flops (30e-m) and corresponding respectively to all but the first flip-flop (30e) and one input of each of said second logic gates (32f-m) is connected to the output of a corresponding one of said flip-flops (30f-m), one output of each flip-flop (30g-m) being connected to an input of all second logic gates (32f-m) subsequent to said second logic gates (32f-m) corresponding to the flip-flop (30f-m) so that a selected flip-flop (30f-m) will inhibit all second logic gates (32f-m) corresponding to flip-flops (30e-m) controlled by first logic gates (22e-m) connected to subsequent sampling taps (20e-m) along said time delay line (12);

a plurality of third logic gates (34e-m) equal in number to said flip-flops (30e-m), one input of a first one (34e) of said third logic gates being connected to the output of a corresponding first one of said flip-flops (30e) and one input of each of the remaining third logic gates (30f-m) being connected to the output of each of said second logic gates (32f-m), a second input of each of said third logic gates (34e-m) being connected to one of said output connections (38e-m); and a fourth logic gate (40), having multiple inputs, with each input of said fourth logic gate (40) being connected to the output of one of said third logic gates (34e-m) so that, in response to a predetermined relationship between said first and second signals (A, C) at a first one of said first logic gates (22e-m), said corresponding flip-flop (30e-m) will be controlled by said third signal thereby inhibiting all subsequent second logic gates (32f-m) and causing the signal at the corresponding signal connection connected to the input of the corresponding third logic gate (34e-m) to pass therethrough and through said fourth logic gate (40).

9. An adjustable time delay circuit (10, 50) including an adjustment feature compensating for environmental influences of components comprising the time delay circuit which environmental influences affect propagation characteristics of data signals passing through the time delay circuit, said circuit comprising:
an input terminal (14);
an output terminal (41);
a plurality of serially connected time delay elements (16) forming a tapped time delay line (12), said time delay line having one end thereof connected to the input terminal;
a data input terminal (64) for accepting incoming data signals;
means (54) for connecting said terminal (64) to said input terminal (14);
means (52) for generating a first signal (A);
means (56) for generating a second signal (C) in response to said first signal;
means (60) responsive to said incoming data signals for generating a control signal (F);
said means (54) responsive to said control signal (F) for disconnecting said data input terminal (64) and connecting said first signal (A) to the input terminal (14);

means (22e-m) responsive to said first signal (A) at a plurality of selected locations along said time delay line (12) and responsive to said second signal (C) for providing one of a plurality of possible control signals in response to a predetermined relationship between said first (A) and said (C) signals; and a plurality of signal activated switches (36e-m), each switch being responsive to a corresponding one of said control signals for connecting a said selected tap (38e-m) of said time delay line (12) to said output terminal (41).

10. An adjustable time delay circuit (10, 50) of claim 9 wherein said delay line (12) comprises a plurality of serially connected inverters (16).

* * * * *

UNITED STATES PATENT OFFICE
CERTIFICATE OF CORRECTION

PATENT NO. : 4,618,787
DATED : October 21, 1986
INVENTOR(S) : Barry H. Jacksier; Gary B. Ollendick It is certified that error appears in the above-identified patent and that said Letters Patent are hereby corrected as shown below:

Column 2, line 50 "provided" should read --providing--,
Column 3, line 1 "between" should read --below--.

In the claims, Column 5, claim 3, line 15 "after" should read --alter--.

Signed and Sealed this

Twenty-fifth Day of October, 1988

Attest:

DONALD J. QUIGG

*Attesting Officer*     *Commissioner of Patents and Trademarks*